(12) United States Patent
Bachus et al.

(10) Patent No.: US 10,771,026 B2
(45) Date of Patent: Sep. 8, 2020

(54) ISOLATION AMPLIFIER

(71) Applicant: Knick Elektronische Messgeräte GmbH & Co. KG, Berlin (DE)

(72) Inventors: Klaus Bachus, Berlin (DE); Harald Zank, Berlin (DE)

(73) Assignee: KNICK ELEKTRONISCHE MESSGERÄTE GMBH & CO. KG, Berlin (DE)

( * ) Notice: Subject to any disclaimer, the term of this patent is extended or adjusted under 35 U.S.C. 154(b) by 0 days.

(21) Appl. No.: 16/322,053

(22) PCT Filed: Jul. 28, 2017

(86) PCT No.: PCT/EP2017/069160
§ 371 (c)(1),
(2) Date: Jan. 30, 2019

(87) PCT Pub. No.: WO2018/024631
PCT Pub. Date: Feb. 8, 2018

(65) Prior Publication Data
US 2019/0190470 A1 Jun. 20, 2019

(30) Foreign Application Priority Data
Aug. 2, 2016 (DE) .......... 10 2016 214 263

(51) Int. Cl.
*H03F 3/38* (2006.01)
*H03F 3/387* (2006.01)
(Continued)

(52) U.S. Cl.
CPC ............ *H03F 3/387* (2013.01); *G01R 15/18* (2013.01); *G01R 15/20* (2013.01); *G01R 15/22* (2013.01);
(Continued)

(58) Field of Classification Search
CPC ...................................................... H03F 3/387
(Continued)

(56) References Cited

U.S. PATENT DOCUMENTS

| 4,952,793 A | * | 8/1990 | Cantrell | ................. | H01J 29/98 |
| | | | | | 250/214 VT |
| 5,077,486 A | * | 12/1991 | Marson | ................... | C23F 13/04 |
| | | | | | 204/196.03 |

(Continued)

FOREIGN PATENT DOCUMENTS

| DE | 29613185 U1 | 1/1997 |
| DE | 102010044180 A1 | 5/2012 |

(Continued)

OTHER PUBLICATIONS

Texas Instruments, NFC and RFID Reader Ultra-Low-Power Card Presence, Detection Using MSP430 and TRF79xxA, Application Report, SLOA 184—(Mar. 2013)—Firmenschrift.
(Continued)

*Primary Examiner* — Patricia T Nguyen
(74) *Attorney, Agent, or Firm* — Browdy and Neimark, PLLC

(57) ABSTRACT

An isolation amplifier includes an input circuit at high voltage potential with an input for a measurement signal to be transmitted, an input circuit configuration providing a coupling section signal representing the measurement signal, and a high-voltage-side control unit for driving the input circuit, a galvanically isolating coupling section for the potential-free transmission of the coupling section signal to an output circuit at low-voltage potential with an output circuit configuration for generating an output signal from the transmitted coupling section signal, an output for the output signal and at least one low-voltage-side control unit for generating control signals, input elements for inputting control commands and/or parameters into the high-voltage-
(Continued)

side control unit, a low-voltage-side arrangement of all the input elements provided for the parameterization of the high-voltage-side control unit, exclusively in a low-voltage circuit, and a galvanically isolating control channel for transmitting the parameters for driving the input circuit.

18 Claims, 3 Drawing Sheets

(51) Int. Cl.
   *G01R 15/22* (2006.01)
   *G01R 15/18* (2006.01)
   *G01R 15/20* (2006.01)
   *H03F 3/68* (2006.01)
   *H03G 3/02* (2006.01)

(52) U.S. Cl.
   CPC ............... *H03F 3/38* (2013.01); *H03F 3/68* (2013.01); *H03G 3/02* (2013.01); *H03F 2200/171* (2013.01); *H03F 2200/228* (2013.01); *H03F 2200/273* (2013.01); *H03F 2200/276* (2013.01); *H03F 2200/375* (2013.01)

(58) Field of Classification Search
   USPC .......................................................... 330/10
   See application file for complete search history.

(56) References Cited

U.S. PATENT DOCUMENTS

| | | | |
|---|---|---|---|
| 7,064,442 B1* | 6/2006 | Lane | H01L 23/495 257/676 |
| 7,902,627 B2* | 3/2011 | Dong | H01L 24/49 257/499 |
| 9,293,997 B2* | 3/2016 | Ma | H02M 3/33523 |
| 2008/0317106 A1* | 12/2008 | Leung | G06F 13/4072 375/220 |
| 2013/0241530 A1 | 9/2013 | Wernet et al. | |
| 2018/0323759 A1* | 11/2018 | Cojocaru | H03F 3/195 |

FOREIGN PATENT DOCUMENTS

| | | |
|---|---|---|
| DE | 102014108497 A1 | 12/2014 |
| DE | 102014102936 A1 | 9/2015 |
| EP | 1278213 A1 | 1/2003 |
| JP | 11108967 A | 4/1999 |

OTHER PUBLICATIONS

Wago, 2857550, JUMPFLEXR—Messumformer, Strommes-sumformer ACIDC 100 A WAGOK ontakttechnik GmbH & Co., Hansastr. 27, 32423 Minden, Mar. 24, 2015 Firmenschrift.
Anonymous: "Trennverstarker—Wikipedia", Jul. 6, 2016 (Jul. 6, 2016), XP055412107, URL:de.wikipedia.org/wiki/Trennver.
ProLine Interface Technology, "High Voltage Transducers" VanTrans, Knick, date approximate 2005.
Knick, "High Voltage Isolator", Manual 2005.
VariTrans P 42000 High Voltage Transducer | Knick, URL :www.knick-international.com/en/products/proline/high-voltage-transducers/varitrans-p-42000/, date approximate 2005.

* cited by examiner

ISOLATION AMPLIFIER

CROSS-REFERENCE TO RELATED APPLICATIONS

This application claims the priority of German patent application Serial No. DE 10 2016 214 263.1, filed on Aug. 2, 2016, pursuant to 35 U.S.C. 119 (a)-(d), the content thereof being incorporated herein by reference in its entirety as if fully set forth herein.

FIELD OF THE INVENTION

The invention relates to an isolation amplifier comprising an input circuit at high voltage potential having an input for a measurement signal to be transmitted, an input circuit for providing a coupling section signal representing the measurement signal, and a high-voltage-side control unit for driving the input circuit configuration, a galvanically isolating coupling section for the potential-free transmission of the coupling section signal to an output circuit at high-voltage potential having an output circuit for generating an output signal representing the measurement signal from the transmitted coupling section signal, an output for the output signal, at least one low-voltage-side control unit for generating control signals, and mechanical and/or electronic input elements for inputting control commands and/or parameters into the high-voltage-side control unit, characterized by a low-voltage-side arrangement of all the input elements, including the input elements provided for the parameterization of the high-voltage-side control unit, exclusively in a low-voltage circuit, and a galvanically isolated control channel for transmitting the parameters for driving the input circuit configuration, said parameters being determined for the high-voltage-side control unit and being input via the low-voltage-side input elements, to the high-voltage-side control unit. Among other things, such isolation amplifiers are also referred to as measurement transformers or measurement transducers.

BACKGROUND OF THE INVENTION

In relation to the background of the invention it should be noted that isolation amplifiers are used, among other things, for the acquisition and conditioning of analog measurement signals with dangerous potentials with regard to currents induced on contact with the human body, and in particular of measurement signals with high-voltage potential. Isolation amplifiers therefore convert the measurement signal, possibly via conversion into auxiliary variables, in a galvanically isolated manner into output signals representing the measurement signal in analog or digital form, wherein the output signals are usually at close to earth potential and are harmless if touched.

In the following descriptions, the term "high voltage" or "high-voltage potential" comprises all voltages and potentials that are dangerous when touched, the term "low voltage" or "low-voltage potential" covers all voltages and potentials that are not dangerous when touched. In the following descriptions therefore, the term "high-voltage isolation amplifier" covers all isolation amplifiers which are suitable for the measurement signal transmission and for the conversion of measurement signals that are dangerous when touched into output signals that are harmless when touched.

In order to enable a galvanic isolation between the high-voltage and low-voltage side, an end-to-end isolation barrier is required, which is implemented in known ways by potential-isolating coupling sections for transmitting a signal representing the measurement signal and, if appropriate, auxiliary variables and electrical energy.

Isolation amplifiers according to the prior art are often designed according to the structure shown in FIG. 3. Three different types of electrical switching circuits can be distinguished, namely an input circuit 1, an output circuit 2 and a primary current supply circuit 41, which are isolated from each other by galvanically isolating coupling sections 3, 42, 43. Each circuit 1, 2, 41 has at least one terminal in the form of the input 6, the output 15 and the primary current supply terminal 44, which is generally conductively connected to the associated electrical circuit. The potentials at which the circuits 1, 2, 41 lie are determined by the potentials of the external signal circuits or external power circuits connected to the associated terminals 6, 15 and 44. The terminals 6, 15 and 44 are also referred to as ports, and therefore FIG. 3 specifies an isolation amplifier with three galvanically separated ports. In detail, the structure shows an input circuit 1 with at least the input 6 for measurement signals with input circuit potential, wherein in the input circuit 1, a coupling section signal representing the measurement signal is generated and this coupling section signal is transmitted via a galvanically isolating coupling section 3 to the output circuit 2 at output circuit potential. In the output circuit 2, the coupling section signal is converted back into a signal which represents the measurement signal, and which can be output via the at least one output 15. The electrical energy required for the operation of all electronic elements in the input circuit 1, output circuit 2 and the coupling section 3 is extracted from the at least one primary power supply terminal 44. The primary power supply terminal 44, which is at primary power circuit potential, delivers the electrical energy to a primary power supply circuit 41, which contains suitable electronic means to deliver electrical energy via the galvanically isolating coupling sections 42 and 43, in each case matching the secondary power supply circuits 45 and 46 of the input and output circuit 1 and 2.

In accordance with the prior art, isolation amplifier structures are known in which the number of coupling sections is reduced. For example, this can be carried out by dispensing with a galvanic isolation between the primary power supply circuit 41 and output circuit 2. The coupling section 43 is then omitted and a direct galvanically conducting connection exists between these circuits instead. Such an isolation amplifier then has only two ports that are galvanically separated from each other.

Another possibility for reducing coupling sections is obtained as follows: the coupling section 42 can be omitted if via a suitable coupling section 3, for example a transformer, both electrical energy from the output circuit 2 to the input circuit 1 as well as a coupling section signal representing the measurement signal are transmitted via the same coupling section 3 from the input 1 to the output circuit 2, represented for example by the electrical current amplitude. The elimination of the coupling section 42 in this case does not reduce the number of ports that are galvanically isolated from each other.

In addition to the coupling sections mentioned, an end-to-end isolation barrier is implemented in general by an encapsulation which is as complete as possible, for example by means of an isolation amplifier housing suitable for this purpose and/or possibly by potting an entire isolation amplifier, or at least by potting all circuit sections that are galvanically connected to the high-voltage potential. Potting is used in particular when the measurement signals have particularly high voltages or potentials. In addition to a potting, other forms of insulation coatings are also possible, such as suitable paints, resins or molding-technology coatings and encapsulation methods.

A potential-isolating coupling section can work by inductive, capacitive, optical, electro-mechanical or electromagnetic coupling or a combination of these, depending on the type of coupling section chosen. Electromechanical coupling sections also include, for example, those which use the piezoelectric effect. The signal to be transmitted, or else the electrical energy to be transmitted, over the coupling section is converted into a signal which is designated generally in the following as a coupling section signal.

The coupling section signal thus includes the term "signal", regardless of whether it is a signal which represents, for example, a measurement signal and/or a signal for transmission of electric energy. The coupling section signal is suitable for transmission over the respective type of galvanically isolating coupling section and, if applicable, for being converted back into such a signal, with which the desired further processing is possible. The conversion of a measurement signal into a coupling section signal and, if applicable, the back conversion of the coupling section signal into a subsequently processable signal representing the measurement signal, can be carried out e.g. by a modulator and demodulator. It goes without saying that for coupling sections which are (also) intended for the transmission of electrical energy, transformers in particular are preferably used. In contrast, commercially available so-called optocouplers are rather unsuitable for the transmission of electrical energy. Accordingly, the electrical energy of a primary power supply circuit can be converted into a suitable signal using well-known power supply topologies and then transmitted in a galvanically isolated manner, for example, with a coupling section implemented as a transformer and then, for example, by means of a rectifier circuit converted into a DC signal for supplying power to the input circuit and the output circuit.

The following explanations of possible coupling section signals, which are also able to represent measurement signals, apply regardless of the temporal waveform and the polarity of an input signal (measurement signal) present at the input of the isolation amplifier. A coupling section signal can be an alternating signal, which is particularly suitable for capacitive and inductive coupling sections. But it can also be an analog-based DC signal (DC voltage or DC current), which can be transmitted, for example, with optical coupling sections. An alternating signal can be an alternating voltage or an alternating current or else a pulsed DC voltage or a pulsed direct current.

Alternating signals can use analog forms of representation and/or contain digital encodings, they can be pulse-, pulse-width-, frequency-, phase-, amplitude- and digitally modulated signals or combinations thereof, wherein other modulation types are possible.

In the case of so-called single-range devices, high-voltage-side elements for device conditioning, such as for setting the gain, offset and frequency bandwidth are calibrated prior to encapsulation, for example, encapsulation by potting. A change in the operation or a subsequent calibration of a fully encapsulated device is then no longer possible without weakening the isolation or, in some cases, even without damage to the isolation. A weakening of the isolation may be simply opening a lid covering the input elements, or the removal of a cover or a suitable housing part of a correspondingly shaped housing for covering such input elements. This is particularly the case for multi-range devices in accordance with the prior art. Input elements can be both operating elements as well as a calibration/configuration/programming interface or any other interface for influencing isolation amplifier functions or isolation amplifier parameters.

To enable a high-voltage-side adjustability and operability of the isolation amplifier, regions of the input circuit can be excluded from encapsulation, e.g. in order to keep mechanically operated controls free of potting compound.

This is the case, for example, in the high-voltage Vari-Trans® P 42000 belonging to the applicant, which represents the closest prior art
   see www.knick-international.com/de/products/proline/high-voltagetransducers/varitrans-p-42000/index.html#-.

In this prior art an input circuit is provided at high-voltage potential with an input for a measurement signal to be transmitted, an input circuit for providing a coupling section signal representing the measurement signal, and an input circuit-side control unit for controlling the input circuit. The measurement signal is transmitted as a coupling section signal in a potential-isolating manner via a galvanically isolating coupling section to an output circuit at low-voltage potential. The latter has an output circuit for generating an output signal representing the measurement signal from the transmitted coupling section signal, an output for the output signal and a low-voltage-side unit for driving the output circuit.

This known multi-range device measures and converts measurement voltages up to 3600 V DC, wherein its isolation is designed for working voltages in AC/DC up to this level. The measuring ranges of the device are selected using a rotary coding switch, which is located electrically on the high-voltage side of the isolation amplifier. Therefore, special design measures are necessary, such as an extension of the plastic shaft of the rotary coding switch, so that the control knob of the rotary coding switch is safe to the touch in the interests of protection against dangerous shock currents. A calibration of such an isolation amplifier at high input voltages is very time-consuming due to the configuration and calibration interface being arranged on the input side. This places high demands on the insulation of test and calibration devices.

Generally speaking therefore, it is apparent that due to the incomplete encapsulation of an isolation amplifier according to the prior art described above, the isolation of the high-voltage input side is weakened. In contrast, it is also apparent that by the transmission of signals representing the measurement signal and, if applicable, auxiliary parameters from the input-circuit side to the output-circuit page and, if applicable, electrical energy within the device via galvanically isolating coupling sections and an arrangement of input elements within an electrical circuit with close to earth potential, for example in the output circuit, no weakening of the high-voltage isolation results. It should be noted here that for the contact protection of a user it is particularly relevant that input elements within a circuit are at such a potential, in general a near-earth potential, which on contact does not cause dangerous shock currents, in other words at a low-voltage potential. A circuit suitable for the arrangement of input elements for an isolation amplifier according to FIG. 3, therefore, cannot only be the output circuit 2 but also the primary power supply circuit 41, provided that the primary power supply connector 44 only has suitable, in general near-earth potentials, in other words only low-voltage potential.

SUMMARY OF THE INVENTION

On the basis of the problems with the prior art described above, the object of the invention is to extend a high-voltage isolation amplifier in such a way that without compromising insulation properties, i.e. in particular maintaining a possible full encapsulation of the device on the high-voltage side, a selection/adjustment of control elements on the input side for signal conditioning, such as gain, offset, frequency bandwidth and the like, and/or a subsequent calibration/matching is enabled.

This object is achieved by an isolation amplifier comprising an input circuit at high voltage potential having an input for a measurement signal to be transmitted, an input circuit for providing a coupling section signal representing the measurement signal, and a high-voltage-side control unit for driving the input circuit configuration, a galvanically isolating coupling section for the potential-free transmission of the coupling section signal to an output circuit at high-voltage potential having an output circuit for generating an output signal representing the measurement signal from the transmitted coupling section signal, an output for the output signal, at least one low-voltage-side control unit for generating control signals, and mechanical and/or electronic input elements for inputting control commands and/or parameters into the high-voltage-side control unit, characterized by a low-voltage-side arrangement of all the input elements, including the input elements provided for the parameterization of the high-voltage-side control unit, exclusively in a low-voltage circuit, and a galvanically isolated control channel for transmitting the parameters for driving the input circuit configuration, said parameters being determined for the high-voltage-side control unit and being input via the low-voltage-side input elements, to the high-voltage-side control unit, according to which all input elements, including those input elements that are used for the parameterization of the high-voltage-side control unit, are arranged exclusively in a circuit of the isolation amplifier which is at low-voltage potential.

In addition, a galvanically isolated control channel is provided for transmission of the parameters for influencing the input circuit that are determined for the high-voltage side control unit and can be input via the low-voltage-side input elements.

As a result of this design according to the invention, it is possible to design fully encapsulated multi-range devices that can be matched and calibrated even retrospectively, thus for example, even when the high-voltage side is already encapsulated. Such a retrospective matching can be necessary, for example, in the context of recurring calibrations, particularly when the high-voltage isolation amplifier is used in metered energy devices.

In addition to the uncompromised high-voltage insulation, further advantages of this design according to the invention of a high-voltage isolation amplifier can be identified.

The changes in the transmission characteristics as a result of the changes to the properties of electronic components and their dielectric environment caused by mechanical, electrical and thermal effects during application and curing of the potting compound used for the encapsulation, as well as by aging effects, can be eliminated by the subsequent calibration capability.

The devices can be completely mechanically and electrically prefabricated, including isolation and encapsulation, and can be calibrated and parameterized on demand in accordance with variable specifications, for example due to differing customer requirements. This can achieve significantly shorter delivery times compared to a production method using encapsulation after calibration/parameterization.

The dependent claims contain preferred extensions of the subject matter of the invention. Thus, due to the approach according to the invention—as shown above—it is possible to provide the input circuit of the isolation amplifier with a high-voltage-insulating full encapsulation, which is formed for example, by a casting of the input circuit. The isolating properties of the device can thereby be optimized.

The galvanically isolated control channel for transmitting the parameters determined for the high-voltage-side control unit can be formed in a preferred way by a separate, galvanically isolating coupling section, which is thus provided in addition to a galvanically isolating coupling section that transmits the measurement signal or in addition to a coupling section that transmits the energy.

An alternative to the galvanically isolating control channel for transmitting the parameters determined for the high-voltage-side control unit for driving the input circuit can also be the use of a bi-directionally operable coupling section.

Finally, the galvanically isolated control channel for transmitting the parameters determined for the high-voltage-side control unit for driving the input circuit can also be implemented by means of a multiply usable coupling section for the potential-free transmission of electrical energy from the primary power circuit to the input circuit.

In particular, proven devices such as transformers or optocouplers can also be reliably used here as the galvanically isolating coupling section.

Various alternatives can be used for the low-voltage-side input elements, including manually operated controls such as rotary coding switches, DIP switches, potentiometers, etc., by means of which adjustable parameters for both the input and output-side components of the device can be input.

On the other hand, these low-voltage-side input elements can also be formed by appropriate interfaces, such as digital connections, for entering configuration and/or calibration parameters.

Further dependent claims relate to the preferred structure of the input and output circuit, the description and elaboration of the advantages of which can be referenced in the description of the exemplary embodiment in order to avoid repetition.

In accordance with a preferred extension, the high voltage-side control unit can be connected to various different control elements, such as an actuator assigned to the input network for selecting between an input-side current or voltage signal, and/or actuators assigned to the pre-amplifier for setting its gain and/or offset.

Similarly, in an advantageous way the output-side control unit can be connected to an actuator assigned to the signal filter unit for selecting the filter cutoff frequency and/or to an actuator assigned to the output stage amplifier for selecting an output-side current or voltage signal. In addition, a certain level of control over gain and offset and the like can also be applied on the output side of the isolation amplifier according to the invention.

Further features, details and advantages of the invention can be obtained from the following descriptions of the exemplary embodiments by reference to the attached drawings.

DESCRIPTION OF THE PREFERRED EMBODIMENTS

Figure 1:
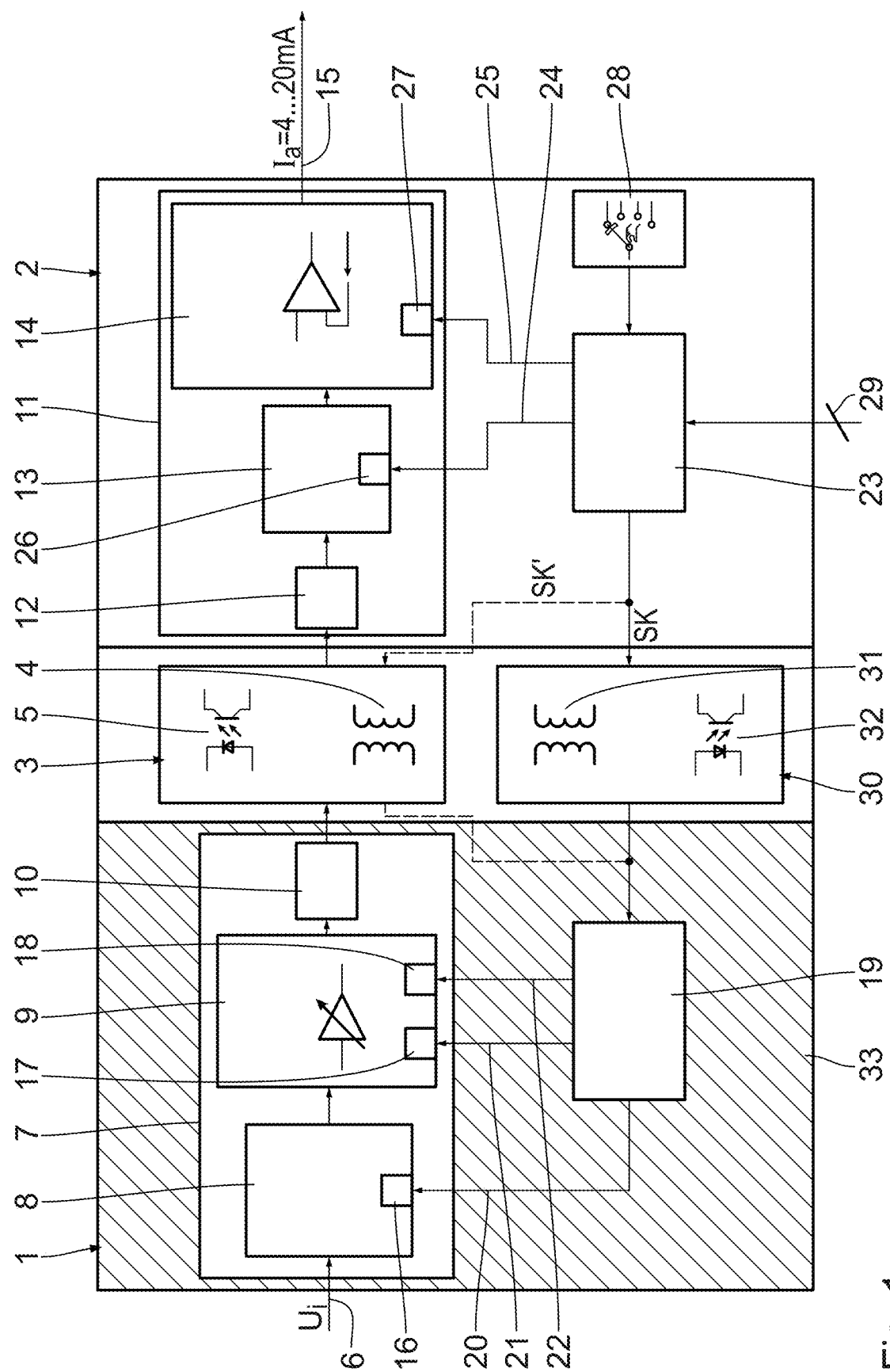
FIG. 1 shows a block diagram of a high-voltage isolation amplifier according to the invention in a first preferred embodiment, wherein the whole of the energy supply is not shown here.

FIG. 1 shows a high-voltage isolation amplifier with an input circuit 1 at high-voltage potential and an output circuit 2 at low-voltage potential, wherein the two circuits are connected by a galvanically isolating coupling section 3 for potential-free transmission of a coupling section signal (which represents the measurement signal). As an example of the coupling section 3 the drawing shows only two possible alternatives, namely an inductively coupling transformer 4 and an opto-coupler 5.

The input circuit 1 has an input 6 at high-voltage potential, for example, to which, for example, a voltage signal $U_i$ in the high-voltage range can be supplied as the parameter to be measured. Downstream of the input 6 is an input circuit labeled as a unit with 7, which comprises an input network 8 with a selectable current and voltage input, a pre-amplifier 9 for the measurement signal $U_i$ to be transmitted and to be processed in the input network 8, and a modulator 10 for providing the coupling section signal to be transmitted, for example in the form of an alternating voltage or alternating current representing the measurement signal $U_i$, or a pulsed DC voltage or pulsed DC current. In accordance with the explanatory comments on coupling section signals given in the introduction, further signal types are possible.

The output circuit 2, in turn, has an output circuit 11 downstream of the coupling section 3, with a demodulator 12 receiving the transmitted coupling section signal for the back conversion of the coupling section signal, a signal filter unit 13 downstream of the demodulator 12, for example in the form of a low-pass filter with cutoff frequency selection, as well as an output stage amplifier 14 downstream of the signal filter unit 13. From this, depending on the setting of the output current or output voltage at an output 15 of the output circuit 2, for example a 4 . . . 20 mA standard signal $I_a$ is output, which is representative of the input-side voltage signal $U_i$, where additional commonly used standard signals as well as customer-specific signals are possible as the output signal. The output of digital signals that represent the input-side voltage signal $U_i$ is possible in a further embodiment.

For the above-mentioned adjustment facilities for the various components on the input and output side, different actuators are provided, namely firstly at the input network 8 an actuator 16 for selecting between a current- or voltage-input signal and, secondly, at the pre-amplifier 9 an actuator 17 for adjusting the gain and an actuator 18 for adjusting the offset of the preamplifier 9.

For driving these actuators 16, 17, 18 a high-voltage-side control unit 19 is provided in the form of an integrated circuit processing logic signals, such as a microcontroller, which is connected via control lines 20, 21, 22, to the actuators 16, 17, 18. In a known manner, the control unit supplies corresponding analog or digital control signals to the actuators 16, 17, 18 in order to make the desired adjustments at the input network 8 or pre-amplifier 9.

The appropriate parameters for driving the input circuit 7 via the control unit 19 according to FIG. 1 are not input into the output circuit 2 on the high-voltage side, but on the low-voltage side, where a control unit 23 is also provided in the output circuit 2 in the form of an integrated circuit processing logic signals, such as a microcontroller. The control unit 23 is required in particular for generating the actual control signals for the control channel SK or SK'. The control unit 23 can also be used to drive the output circuit 11, however. This control unit 23 in this case is connected via control lines 24, 25 to corresponding actuating elements 26, 27 on the signal filter unit 13 or on the output stage amplifier 14. The actuator 26 is used to select the cutoff frequency of the signal filter unit 13, while the actuator 27 is used for switching the output between a current and voltage signal.

To enter the corresponding parameters into the output-side control unit 23, on the one hand a mechanical, manually actuated adjustment element 28 is used, in the form of a rotary coding switch e.g. for selecting the input-side and if applicable, the output-side signal characteristics. On the other hand, an interface 29 is provided, for example in the form of a digital data interface, which allows configuration and calibration data to be entered, for example for adjusting the gain and offset on the pre-amplifier 9 and possibly setting the cutoff frequency on the signal filter unit 13.

The relevant adjustment parameters for the high-voltage side are accordingly prepared in the output-side control unit 23 in accordance with FIG. 1 and transmitted via a galvanically isolated control channel SK in the form of a second galvanically isolating coupling section 30 provided between output circuit 2 and input circuit 1, to the high-voltage-side control unit 19, where they are passed to the actuators 16, 17, 18 appropriately converted. The second coupling section 30, in the same way as the first coupling section 3, may in turn be formed by means of a transformer 31 or an optocoupler 32 or, for example, by a capacitive transducer or other types of coupling sections, as already mentioned earlier.

It is apparent that despite a complete encapsulation 33 of a portion of the high-voltage isolation amplifier, shown in the drawing by a cross-hatched area, in the form of an encapsulation of the input circuit 1, such adjustments, calibrations and offset balancing operations can be performed at any time during the lifetime of the device.

As shown in dashed lines in FIG. 1, in an alternative design a galvanically isolated control channel SK' for the transmission of the adjustment parameters relevant to the high-voltage-side from the output-side control unit 23 to the input-side control unit 19 can also be formed without the second coupling section 30 by means of the coupling section 3, which then operates bidirectionally.

Figure 2:
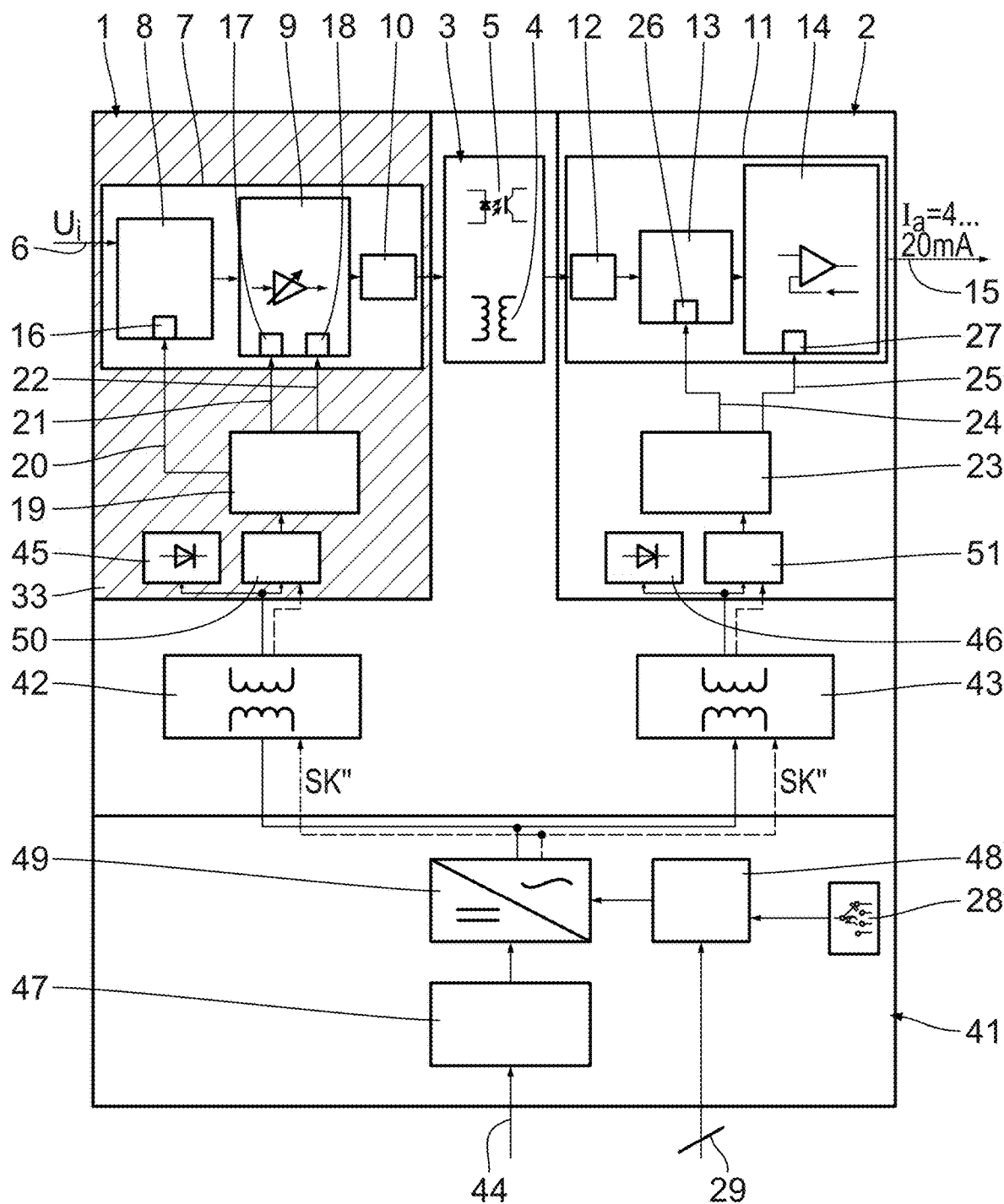
FIG. 2 shows a block diagram of a high-voltage isolation amplifier according to the invention in a second preferred embodiment with a primary power supply circuit.
Figure 3:
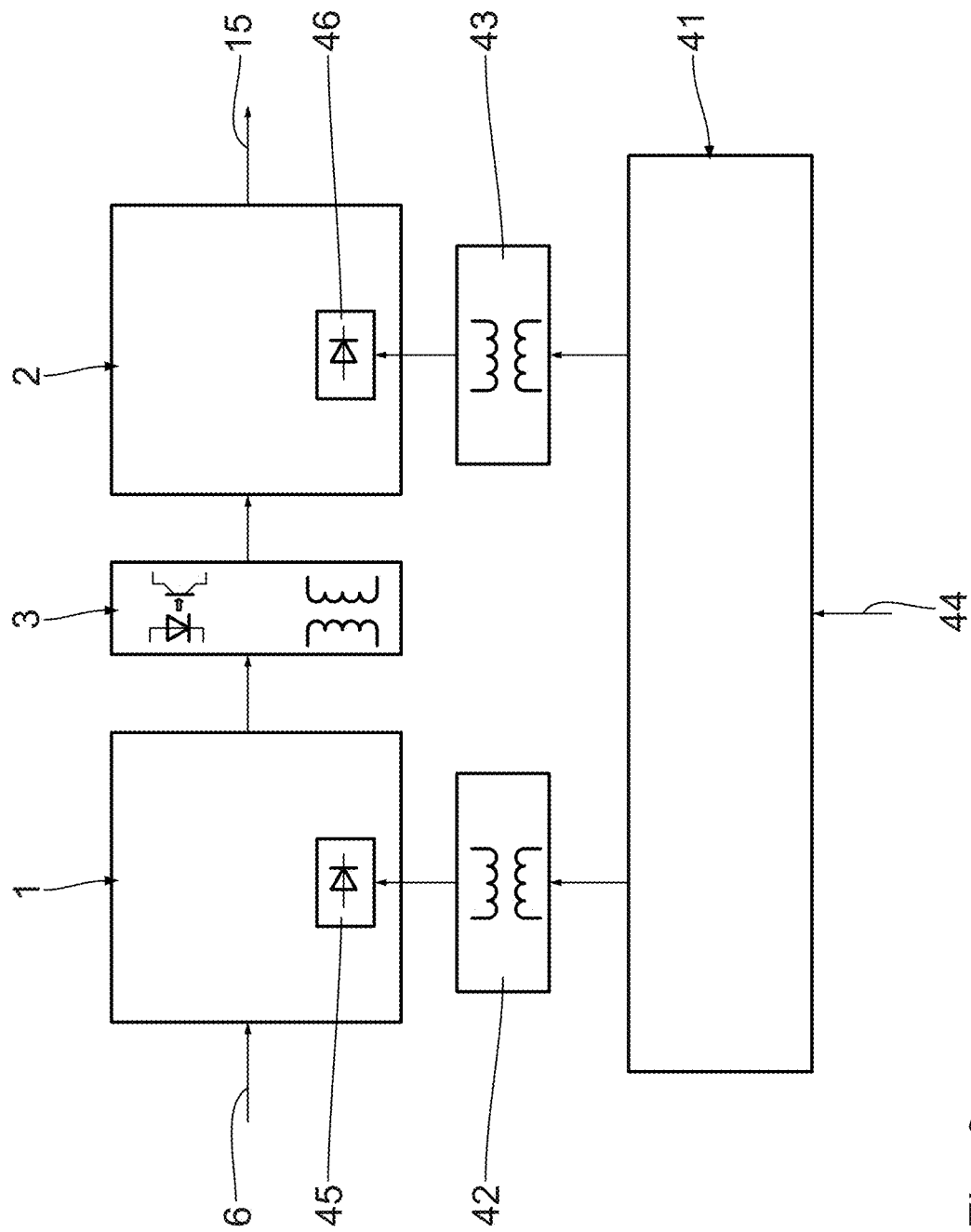
FIG. 3 shows a block diagram of a high-voltage isolation amplifier according to the prior art.

FIG. 2 shows a further design of an isolation amplifier according to the invention, which is practical in specific applications, wherein here the parts are only described where they differ from the isolation amplifier shown in FIG. 1 or are not shown in FIG. 1. In contrast to FIG. 1, FIG. 2 also includes the energy supply of the isolation amplifier, corresponding to the structure of FIG. 3, which is already known and explained. The primary power supply circuit 41 at low-voltage potential contains a matching circuit 47 for matching the electrical energy arriving via the primary power supply connection 44 to the primary power supply circuit 49. The primary power supply circuit 49 generates the coupling section signals suitable for the energy transmission for the two galvanically isolating coupling sections 42, 43 and is also suitably designed to provide a control channel SK", shown by a dashed line, in the coupling section signals. The information of the control channel SK" necessary to control the control units 19 and 23 is provided by the control device 48 arranged in the primary power supply circuit 41, which in turn receives control signals via the input elements 28, 29, which are also arranged in the primary power supply circuit 41. The control device 48 can be implemented in the form of an integrated circuit processing logic signals, such as a microcontroller.

The electrical energy and the control channel SK'' are passed via the coupling sections 42 and 43 to secondary rectifier circuits 45, 46 and to decoupling circuits 50 and 51 for decoupling the control channel from the respective coupling section signal of the coupling section 42 and 43. The decoupling circuits in this case can act as demodulators and generate the appropriate control signals for further processing in the control units 19 and 23. Therefore, in this possible design also, it is possible to control and influence in particular the input side at high-voltage potential with respect to the transmission parameters already described, wherein here also the input elements are arranged in a circuit at low-voltage potential, thus producing the previously mentioned advantages of an isolation amplifier according to the invention here also. It goes without saying that here, instead of a common usage of the coupling sections 42 and 43 for the transmission of both electrical energy and the control channel SK'', a separate coupling section, operating only for the control channel SK'' is also possible. In addition, in a further embodiment the control unit 23 may be omitted if no provision is made for controlling parameters on the output side based on the inputs via the input elements 28, 29. In this case, the part of the control channel SK'' leading to the output side, which passes via the coupling section 43, and the decoupling circuit 51 are also omitted.

The invention claimed is:

1. An isolation amplifier comprising
  an input circuit at high voltage potential having
  an input for a measurement signal to be transmitted,
  an input circuit for providing a coupling section signal representing the measurement signal, and
  a high-voltage-side control unit for driving the input circuit configuration,
  a galvanically isolating coupling section for the potential-free transmission of the coupling section signal to
  an output circuit at low-voltage potential having
  an output circuit for generating an output signal representing the measurement signal from the transmitted coupling section signal,
  an output for the output signal,
  at least one low-voltage-side control unit for generating control signals, and
  at least one of the group comprising a mechanical and electronic input elements for inputting at least one of the group comprising control commands and parameters into the high-voltage-side control unit,
  comprising
  a low-voltage-side arrangement of all the input elements, including the input elements provided for the parameterization of the high-voltage-side control unit, exclusively in a low-voltage circuit, and
  a galvanically isolated control channel for transmitting the parameters for driving the input circuit configuration, said parameters being determined for the high-voltage-side control unit and being input via the low-voltage-side input elements, to the high-voltage-side control unit,
  wherein the galvanically isolated control channel for transmitting the parameters for driving the input circuit to the high-voltage-side control unit, said parameters being determined for the high-voltage-side control unit and being input via the input elements arranged in a primary current supply circuit, is realized by a repeatedly usable coupling section for the potential-free transmission of electrical energy to the input circuit.

2. The isolation amplifier as claimed in claim 1, comprising a high-voltage insulating full encapsulation of the input circuit.

3. The isolation amplifier as claimed in claim 2, wherein the full encapsulation is formed by potting the input circuit.

4. The isolation amplifier as claimed in claim 1, wherein the galvanically isolated control channel for transmitting the parameters for driving the input circuit configuration to the high-voltage-side control unit, said parameters being determined for the high-voltage-side control unit and being input via the low-voltage-side input elements, is realized by a separate galvanically isolating coupling section.

5. The isolation amplifier as claimed in claim 1, wherein the galvanically isolated control channel for transmitting the parameters for driving the input circuit configuration to the high-voltage-side control unit, said parameters being determined for the high-voltage-side control unit and being input via the low-voltage-side input elements, is realized by the bidirectionally operable coupling section for the potential-free transmission of the coupling section signal to the output circuit.

6. The isolation amplifier as claimed in claim 1, wherein input elements arranged on the output side are formed by manually activated adjustment elements for inputting adjustment parameters.

7. The isolation amplifier as claimed in claim 1, wherein the input elements arranged on the output side are formed by at least one interface for inputting at least one of the group comprising configuration and calibration parameters.

8. The isolation amplifier as claimed in claim 4, wherein the galvanically isolating coupling section for the transmission of the parameters determined for the high-voltage-side control unit is formed by one of the group comprising means of a transformer and an optocoupler (32).

9. The isolation amplifier as claimed in claim 1, wherein the input circuit comprises:
  an input network connected downstream of the input,
  a pre-amplifier connected downstream of the input network for the measurement signal to be transmitted, and
  a modulator for providing the coupling section signal for transmission via the galvanically isolating coupling section.

10. The isolation amplifier as claimed in claim 1, wherein via a low-voltage side control unit the transmission behavior of the output circuit can be influenced by parameters input using the input elements.

11. The isolation amplifier as claimed in claim 1, wherein the output circuit comprises:
  a demodulator for demodulating the transmitted coupling section signal,
  a signal filter unit connected downstream of the demodulator for the demodulated coupling section signal, and
  an output stage connected downstream of the signal filter unit.

12. The isolation amplifier as claimed in claim 9, wherein the high voltage-side control unit is connected to:
  an actuator assigned to the input network for selecting between an input-side current/voltage signal, and
  an actuator assigned to the pre-amplifier for gain adjustment.

13. The isolation amplifier as claimed in claim 9, wherein the high voltage-side control unit is connected to an actuator assigned to the pre-amplifier for offset adjustment.

14. The isolation amplifier as claimed in claim 10, wherein the low-voltage side control unit is connected to an actuator assigned to a signal filter unit for selecting the critical frequency thereof.

15. The isolation amplifier as claimed in claim 10, wherein the low-voltage side control unit is connected to an actuator assigned to an output stage for selecting between output-side current/voltage signal.

16. An isolation amplifier comprising
an input circuit at high voltage potential having
an input for a measurement signal to be transmitted,
an input circuit for providing a coupling section signal representing the measurement signal, and
a high-voltage-side control unit for driving the input circuit configuration,
a galvanically isolating coupling section for the potential-free transmission of the coupling section signal to
an output circuit at low-voltage potential having
an output circuit for generating an output signal representing the measurement signal from the transmitted coupling section signal,
an output for the output signal,
at least one low-voltage-side control unit for generating control signals, and
at least one of the group comprising a mechanical and electronic input elements for inputting at least one of the group comprising control commands and parameters into the high-voltage-side control unit, comprising
a low-voltage-side arrangement of all the input elements, including the input elements provided for the parameterization of the high-voltage-side control unit, exclusively in a low-voltage circuit, and
a galvanically isolated control channel for transmitting the parameters for driving the input circuit configuration, said parameters being determined for the high-voltage-side control unit and being input via the low-voltage-side input elements, to the high-voltage-side control unit,
wherein input elements arranged on the output side are formed by manually activated adjustment elements for inputting adjustment parameters.

17. An isolation amplifier comprising
an input circuit at high voltage potential having
an input for a measurement signal to be transmitted,
an input circuit for providing a coupling section signal representing the measurement signal, and
a high-voltage-side control unit for driving the input circuit configuration,
a galvanically isolating coupling section for the potential-free transmission of the coupling section signal to
an output circuit at low-voltage potential having
an output circuit for generating an output signal representing the measurement signal from the transmitted coupling section signal,
an output for the output signal,
at least one low-voltage-side control unit for generating control signals, and
at least one of the group comprising a mechanical and electronic input elements for inputting at least one of the group comprising control commands and parameters into the high-voltage-side control unit, comprising
a low-voltage-side arrangement of all the input elements, including the input elements provided for the parameterization of the high-voltage-side control unit, exclusively in a low-voltage circuit, and
a galvanically isolated control channel for transmitting the parameters for driving the input circuit configuration, said parameters being determined for the high-voltage-side control unit and being input via the low-voltage-side input elements, to the high-voltage-side control unit,
wherein via a low-voltage side control unit the transmission behavior of the output circuit can be influenced by parameters input using the input elements, and
wherein the low-voltage side control unit is connected to an actuator assigned to a signal filter unit for selecting the critical frequency thereof.

18. An isolation amplifier comprising
an input circuit at high voltage potential having
an input for a measurement signal to be transmitted,
an input circuit for providing a coupling section signal representing the measurement signal, and
a high-voltage-side control unit for driving the input circuit configuration,
a galvanically isolating coupling section for the potential-free transmission of the coupling section signal to
an output circuit at low-voltage potential having
an output circuit for generating an output signal representing the measurement signal from the transmitted coupling section signal,
an output for the output signal,
at least one low-voltage-side control unit for generating control signals, and
at least one of the group comprising a mechanical and electronic input elements for inputting at least one of the group comprising control commands and parameters into the high-voltage-side control unit, comprising
a low-voltage-side arrangement of all the input elements, including the input elements provided for the parameterization of the high-voltage-side control unit, exclusively in a low-voltage circuit, and
a galvanically isolated control channel for transmitting the parameters for driving the input circuit configuration, said parameters being determined for the high-voltage-side control unit and being input via the low-voltage-side input elements, to the high-voltage-side control unit,
wherein via a low-voltage side control unit the transmission behavior of the output circuit can be influenced by parameters input using the input elements, and
wherein the low-voltage side control unit is connected to an actuator assigned to the output stage for selecting between output-side current/voltage signal.

\* \* \* \* \*